United States Patent
Gotoh et al.

(10) Patent No.: US 6,462,005 B1
(45) Date of Patent: *Oct. 8, 2002

(54) CLEANING AGENT FOR A SEMICONDUCTOR DEVICE AND A METHOD OF MANUFACTURING A SEMICONDUCTOR DEVICE

(75) Inventors: Hideto Gotoh, Niihari-mura; Tetsuo Aoyama, Niigata; Rieko Nakano, Niigata; Hideki Fukuda, Niigata, all of (JP)

(73) Assignees: Texas Instruments Incorporated, Dallas, TX (US); Mitsubishi Gas Chemical Company, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/369,215

(22) Filed: Jan. 5, 1995

(30) Foreign Application Priority Data

Jan. 7, 1994 (JP) .............................................. 6-000520

(51) Int. Cl.$^7$ .............................. C11D 1/62; C11D 3/24; C11D 3/43
(52) U.S. Cl. ....................... 510/176; 510/255; 510/257; 510/259; 510/434; 510/504
(58) Field of Search ................. 252/547, 142, 252/162, 170, 171; 510/176, 255, 257, 259, 434, 504

(56) References Cited

U.S. PATENT DOCUMENTS

| | | | | |
|---|---|---|---|---|
| 3,553,143 A | * | 1/1971 | Bauer | 252/152 |
| 3,915,882 A | * | 10/1975 | Nirschl et al. | 252/131 |
| 4,056,531 A | * | 11/1977 | Malec | 260/268 |
| 4,127,692 A | * | 11/1978 | Boynton | 428/137 |
| 4,184,970 A | * | 1/1980 | Draper, Jr. | 252/8.8 |
| 4,239,661 A | * | 12/1980 | Muraoka et al. | 252/541 |
| 4,265,772 A | * | 5/1981 | Jones | 252/8.6 |
| 4,520,084 A | * | 5/1985 | Tinker et al. | 429/101 |
| 4,522,658 A | * | 6/1985 | Walker | 148/6.14 |
| 4,647,480 A | * | 3/1987 | Ahmed | 427/341 |
| 4,906,349 A | * | 3/1990 | Beatrice et al. | 204/422 |
| 5,108,544 A | * | 4/1992 | Hakansson | 156/664 |
| 5,174,816 A | * | 12/1992 | Aoyama et al. | 106/203 |

* cited by examiner

Primary Examiner—Gregory Delcotto
(74) Attorney, Agent, or Firm—William B. Kempler; Frederick J. Telecky, Jr.; W. James Brady

(57) ABSTRACT

A cleaning agent for use in the manufacture of a semiconductor device comprising an aqueous solution containing a quarternary ammonium salt and a fluoro compound, or an aqueous solution containing a quarternary ammonium salt and a fluoro compound, as well as an organic solvent selected from the group consisting of amides, lactones, nitriles, alcohols and esters. In the semiconductor device manufacturing process, after forming a mask with a photoresist, a wiring structure is formed by dry etching of a conductive layer, wherein a protecting deposition film has been formed on side walls of the conductive layer. Use of the cleaning agent enables the protecting deposition film to be removed in a highly reliable manner with the surface of the conductive layer being decontaminated and cleaned such that no corrosion of the conductive layer occurs.

15 Claims, 4 Drawing Sheets

CLEANING AGENT FOR A SEMICONDUCTOR DEVICE AND A METHOD OF MANUFACTURING A SEMICONDUCTOR DEVICE

The present invention concerns a cleaning agent used in a process for manufacturing a semiconductor device and a method of manufacturing a semiconductor device.

BACKGROUND OF THE INVENTION

In the process of manufacturing a semiconductor device, an etching fabrication technique utilizing chemical reaction has been used as a method of forming a wiring structure on a semiconductor substrate by using a conductive material.

Generally, a method of initially applying a mask fabrication technique by photoresist and then removing a non-masked portion by using a chemical or a reactive gas has been practiced. In the semiconductor industry in recent years, the tendency toward a high degree of integration requires microscopic processing. In particular, the fabrication of metal film wirings has been demanded more and more and a fabrication technique aiming for an accuracy of less than 0.5 um has been demanded for present-day semiconductor devices.

In order to attain such a degree of accuracy, improvement in the fabrication accuracy where a photoresist mask is employed and improvement in the dry etching technique for removing the non-masked portion are necessary. Referring particularly to the use of photoresist material, conventional positive or negative type resists of a single layered structure, as well as a multi-layered resist structure using a combination of resist and other resins have been used.

Further in the dry etching technique, anisotropic etching has been advanced with the establishment of a technique for providing side wall protecting deposition films by using the photoresist and reactive gases and etching at higher selectivity.

As a disadvantage accompanying the establishment of such techniques, there can be mentioned an extreme difficulty in the method of removing the side wall protecting deposition films and the corrosion of metal wiring materials. If the side wall protecting deposition film has not been removed sufficiently, radicals or ions in the reaction gas incorporated into the side wall protecting deposition film react with intaken moisture to form an acid when left in air after the completion of the etching procedure. The thus-formed acid results in corrosion of wiring materials to bring about significant undesired effects such as an increase in resistance and breaks in the wire. Particularly, such a phenomenon frequently occurs, for example, in aluminum and aluminum alloy used generally as the wiring material.

For preventing such corrosion, a method has been adopted involving the washing out of chlorine radicals or ions by applying highly purified water for cleaning purposes over a long period of time after dry etching. However, it is extremely difficult to completely remove chlorine ions or radicals from the side wall protecting deposition film by this method, so that the problem of corrosion can not be avoided completely. Accordingly, complete removal of the side wall protecting deposition film would be required in order to thoroughly prevent the corrosion.

For removing such a side wall protecting deposition film, a resist cleaning agent of an acidic organic solvent or a resist cleaning agent of an alkaline organic solvent has been used.

As the resist cleaning agent of the acidic organic solvent, a cleaning agent prepared by adding a phenol compound, chloro solvent or aromatic hydrocarbon to alkylbenzene sulfonic acid has generally been used. However, it is not possible to completely remove the side wall protecting deposition film even by applying a heat treatment at a temperature of higher than 100° C. by using this cleaning agent. Further, since the resist cleaning agent of the acidic organic solvent is less soluble in water, it is necessary to clean with an organic solvent such as iso-propanol having good solubility with water after the removing operation and then wash with water, which however complicates the process.

On the other hand, it is also rather difficult to remove the side wall protecting deposition film by using the resist cleaning agent of the alkaline organic solvent even by heating to a temperature higher than 100° C. like that of an acidic cleaning solution. As described above, since the side wall protecting deposition film can not completely be removed using either the acidic or alkaline cleaning agent, occurrence of corrosion caused by residual chlorine radicals or ions is inevitable.

As a method different from the cleaning method described above, there has been known a method of removing the residual resist after plasma ashing by using an alkaline aqueous solution such as a positive type resist developing solution containing tetramethyl ammonium hydroxide (Japanese Patent Laid-Open Sho 62-281332). However, a conductive layer made of an aluminum-containing substance is violently eroded with the alkaline aqueous solution in this method.

Further, for the protecting deposition film formed upon dry etching of a titanium or tungsten layer, a method of removing the film has not yet been established. The titanium or tungsten layer is often used as metal wirings for an intermediate layer upon making a conductive layer into a multi-layered structure in a semiconductor device.

If the resultant side wall protecting deposition film is left as it is, adjacent wirings are brought into contact by the side wall protecting deposition film, for example, due to pressure of the deposition film in the succeeding step to cause a short-circuit or an abnormality in the wirings.

As has been described above, while various methods have been employed in a production process for a semiconductor device for removing the side wall protecting deposition film formed on the side walls of the conductive layer or removing photoresist formed on the semiconductor substrate, there is a problem such as the occurrence of corrosion of the metal wiring and it is required for a cleaning agent for a semiconductor device to be capable of easily removing the side wall protecting deposition film, while not causing corrosion of the metal conductive layer upon cleaning.

It is an object of the present invention to provide a cleaning agent for a semiconductor device capable of easily removing a side wall protecting deposition film formed by dry etching, while causing no corrosion to a conductive layer made of various kinds of metal material as the wiring material and not resulting in corrosion at all, as well as a method of manufacturing a semiconductor device capable of manufacturing circuit wirings at a high level of accuracy.

SUMMARY OF THE INVENTION

In accordance with the present invention, it has been determined that a cleaning agent for a semiconductor device comprising an aqueous solution containing a quarternary ammonium salt and a fluoro compound or an aqueous solution containing a quarternary ammonium salt and a fluoro compound, as well as an organic solvent selected from the group consisting of amides, lactones, nitrites, alcohols and esters exhibits excellent characteristics having a property of removing a side wall protecting deposition film formed upon dry etching, corrosion inhibitive property, and possesses a non-corrosive nature with respect to wiring materials and good operation performance.

That is, the present invention provides a cleaning agent for a semiconductor device comprising a quarternary ammonium salt represented by the general formula:

$$[(R_1)_3N\text{—}R]^+\cdot X^-$$

in which R represents an alkyl group of 1 to 4 carbon atoms or a hydroxyl substituted alkyl group of 1 to 4 carbon atoms, $R_1$ represents an alkyl group of 1 to 4 carbon atoms and X represents an organic or inorganic acid group, and a fluoro compound.

The present invention further provides a cleaning agent for a semiconductor device, wherein from 1 to 50% by weight of one or more of organic solvents selected from amides, lactones, nitrites, alcohols and esters are present in addition to the quarternary ammonium salt and the fluoro compound.

The present invention further provides a method of manufacturing a semiconductor device by forming a mask with a photoresist on a conductive layer formed on a semiconductor substrate, wherein the conductive layer contains at least one of titanium, tungsten, aluminum and aluminum alloy and then forming a wiring structure by dry etching, wherein the method includes a cleaning step of peeling a protecting deposition film formed on side walls for the conductive layer and the photoresist by using a cleaning agent for a semiconductor device comprising a quarternary ammonium salt represented by the general formula:

$$[(R_1)_3N\text{—}R]^+\cdot X^-$$

which R represents an alkyl group of 1 to 4 carbon atoms or a hydroxyl substituted alkyl group of 1 to 4 carbon atoms, $R_1$ represents an alkyl group of 1 to 4 carbon atoms and X represents an organic or inorganic acid group, and a fluoro compound.

The quarternary ammonium salt represented by the foregoing general formula can include, for example, tetramethyl ammonium formate, tetramethyl ammonium acetate, tetramethyl ammonium propionate, tetramethyl ammonium butyrate, tetramethyl ammonium oxalate, tetramethyl ammonium malonate, tetramethyl ammonium maleate, tetramethyl ammonium fumarate, tetramethyl ammonium citraconate, tetramethyl ammonium benzoate, tetramethyl ammonium toluate, tetramethyl ammonium phthalate, tetramethyl ammonium acrylate, trimethyl(2-hydroxyethyl) ammonium formate, trimethyl(2-hydroxyethyl)ammonium acetate, trimethyl(2-hydroxyethyl)ammonium benzoate, trimethyl(2-hydroxyethyl)ammonium phthalate, tetraethyl ammonium formate, tetraethyl ammonium acetate, tetrapropyl ammonium formate, tetrapropyl ammonium acetate, tetrabutyl ammonium formate, tetrabutyl ammonium acetate, tetramethyl ammonium borate, tetramethyl ammonium phosphate, tetramethyl ammonium sulfate, trimethyl(2-hydroxyethyl)ammonium borate, trimethyl(2-hydroxyethyl)ammonium phosphate and trimethyl(1-hydroxyethyl)ammonium sulfate.

The concentration of the quarternary ammonium salt in the cleaning agent for the semiconductor device according to the present invention is within a range of from 1 to 60% by weight, preferably 10 to 50% by weight. If the concentration of the quarternary ammonium salt is less than 1% by weight, violent corrosion occurs in the wiring material whereas if it is more than 60% by weight, the removing rate for the side wall protecting deposition film is lowered, which is not desirable.

As the fluoro compound in the cleaning agent for the semiconductor device according to the present invention there can be mentioned, for example, hydrofluoric acid, ammonium fluoride, ammonium hydrogen fluoride, ammonium borofluoride, tetramethyl ammonium fluoride and tetramethyl ammonium hydrogen fluoride.

The concentration of the fluoro compound is from 0.1 to 10% by weight, preferably 0.5 to 5% by weight. If the concentration of the fluoro compound is less than 0.1% by weight, the removing rate for the side wall protecting deposition film is lower, whereas violent corrosion occurs to the wiring material at a concentration higher than 10% by weight.

As the organic solvent added further in the present invention, there can be mentioned amides such as dimethyl formamide, dimethyl acetamide, formamide and N-methyl pyrrolidone, lactones such as  butyrolactone, nitriles such as acetonitrile and benzonitrile, alcohol such as methanol, ethanol, isopropanol and ethylene glycol and esters such as methyl acetate, ethyl acetate an d methyl benzoate.

The concentration of the organic solvent is from 1 to 60% by weight, preferably 20 to 55% by weight. If the concentration of the organic solvent is less than 1% by weight, violent corrosion occurs to the wiring material, whereas the removing rate for the side wall protecting deposition film is lowered at a concentration higher than 60% by weight.

The temperature for the cleaning agent for the semiconductor device according to the present invention upon removing the side wall protecting deposition film is usually at a normal temperature, for example, 18 to 25° C. If the removing rate for the side wall protecting deposition film is remarkably low, the cleaning agent should be heated, for example, at 25 to 60° C. Further, the cleaning temperature and the cleaning time are properly selected considering the state of the side wall protecting deposition film and the kind of the wiring materials.

Upon peeling of the side wall protecting deposition film by cleaning, the peeling step employs a method used so far by the cleaning according to the present invention for the semiconductor substrate to be processed. For example, dipping cleaning by batch system or spray or jet cleaning for each substrate and then cleaning with purified water and drying are applied by the above-mentioned system to complete the process.

Figure 1:
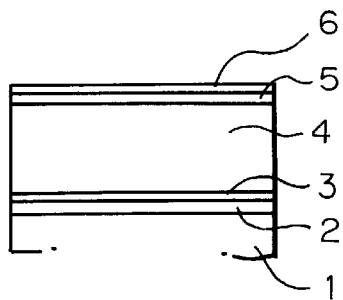
FIG. 1 is a cross sectional view showing a stage in the method of manufacturing a semiconductor device after formation of a conductive layer in a first example according to the invention.

Reference numerals as shown in the drawings:
1 CVD oxide layer
2 TiW layer
3 CVD-W layer
4 Al—Si—Cu layer
5 TiN layer
6 PLASMA TEOS layer
7 photoresist
8 side wall protecting deposition film
9 CVD oxide layer
10 Ti layer
11 TiN layer
12 W (tungsten) layer
13 photoresist
14 side wall protecting deposition film

DESCRIPTION OF PREFERRED EMBODIMENTS

The cleaning agent for the semiconductor device according to the present invention is used in the process for manufacturing the semiconductor device for removing a protecting deposition film formed on the side walls of the conductive layer and the photoresist when a wiring structure by dry etching is formed after forming a mask with the photoresist for the conductive layer formed semiconductor substrate with a positive or negative type single layered photoresist or a multi-layered photoresist. Since the protecting deposition film can be peeled highly reliably, the surface of the conductive layer is rendered free of contamination and is cleaned, so that no corrosion occurs.

Further the cleaning agent for the semiconductor device according to the present invention is also applicable to the removal of the protecting deposition film formed upon dry etching of a titanium or tungsten layer which has been difficult so far, and can be used effectively in the manufacture of a semiconductor device or highly integrated circuit of a multi-layered structure.

The present invention will now be explained more specifically with reference to specific examples.

EXAMPLE 1

When a mask is formed with photoresist on a semiconductor device following the formation of a conductive layer as shown in FIG. 1 and a wiring structure is formed by dry etching, a side wall protecting deposition film formed on the side walls of the conductive layer and the photoresist were cleaned.

In a semiconductor device just after forming a conductive layer shown in FIG. 1, there were formed on a CVD oxide layer 1 as an intermediate insulation film, a TiW layer 2 as a first metal film layer, a CVD-W layer 3 as a second metal film layer, an Al—Si—Cu layer 4 as a third metal film layer, a TiN layer 5 as anti-reflection film and a PLASMA TEOS layer 6 as an chemical resistant protecting film successively. Each of the metal films has a thickness of 600 Å for the first metal film layer 2, 500 Å for the second metal film layer 3, 5000 Å for the third metal film layer, 200 Å for the TiN layer 5 as the upper film layer and 400 Å for the PLASMA TEOS film 6. The Al—Si—Cu layer 4 contained 1 wt % of Si and 0.5% by weight of Cu.

Figure 2:
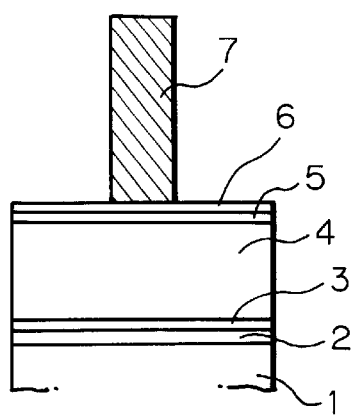
FIG. 2 is a cross sectional view showing a stage in the method of manufacturing a semiconductor device subsequent to the stage shown in FIG. 1 and illustrating a mask forming step.

FIG. 2 shows a structure upon completion as far as a mask forming process. A positive type photoresist 7 was coated on the conductive layer shown in FIG. 1 and then exposed to form a resist mask area. The photoresist 7 used had a multi-layered resist mainly composed of a novolac resin.

Figure 3:
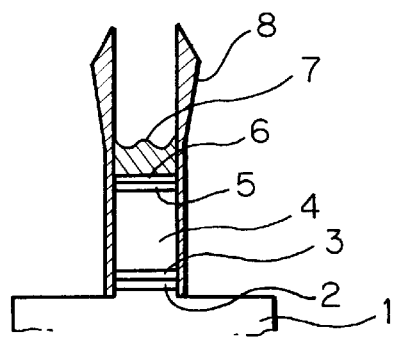
FIG. 3 is a cross sectional view showing a subsequent stage in the method after removing a region of the conductive layer not covered with a photo-mask from the semiconductor device by dry etching.

FIG. 3 shows a structure after removing a region of the conductive layer not covered with the photo-mask (non-masked region) by dry etching using a chloro gas. Formation of the side wall protecting deposition film 8 was already observed on the side of the patterned conductive layer.

Figure 4:
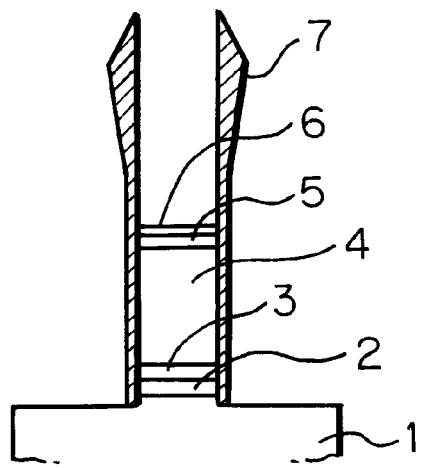
FIG. 4 is a cross sectional view of a further stage in the method and showing the semiconductor device after removing the masking resist by ashing and cleaning with an organic solvent after dry etching.

FIG. 4 shows a structure after removing the masking resist by ashing and cleaning with the organic solvent after dry etching. It was confirmed that removal of the side wall protecting deposition film 8 was difficult by this method.

Figure 5:
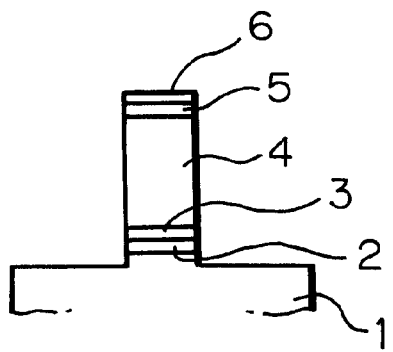
FIG. 5 is a cross sectional view of a further stage in the method after cleaning the semiconductor device shown in FIG. 4 by using the cleaning agent for the semiconductor device in the first example according to the present invention.

FIG. 5 shows the structure after cleaning the semiconductor device shown in FIG. 4 by using the cleaning agent for the semiconductor device according to the present invention. A solution of ammonium fluoride/tetramethyl ammonium formate/dimethyl formamide/water at 1/10/40/49 (wt % ratio) was used as the cleaning agent for the semiconductor device and cleaning was applied at 20° C. for 20 min followed by water rinsing.

It can be seen from FIG. 5 that the side wall protecting deposition film 8 in FIG. 4 is completely removed by using the cleaning agent for the semiconductor device according to the present invention, so that the surface of the patterned conductive layer has been rendered free of contamination and is cleaned.

EXAMPLE 2

The same semiconductor device as that in FIG. 4 for Example 1 was cleaned by using a cleaning solution comprising a composition of ammonium fluoride/tetramethyl ammonium formate/water at 2/45/53 (wt % ratio) at 23° C. for 20 min and then rinsed with water. As a result, the side wall protecting deposition film was removed completely in the same manner as in Example 1, so that the surface of the patterned conductive layer was decontaminated and cleaned.

EXAMPLE 3

The same semiconductor device as that in FIG. 4 for Example 1 was cleaned by using a cleaning solution comprising a composition of tetramethyl ammonium fluoride/tetramethyl ammonium acetate/dimethyl acetoamide/water at 5/15/40/40 (wt % ratio) at 25° C. for 30 min and then rinsed with water. As a result, the side wall protecting deposition film was removed completely in the same manner as in Example 1, so that the surface of the patterned conductive layer was decontaminated and cleaned.

Comparative Example 1

The same semiconductor device as that in FIG. 4 for Example 1 was cleaned by using a commercially available cleaning solution (alkaline resist cleaning solution) under the cleaning conditions at 100° C. for 10 min. As a result, the side wall protecting deposition film could not be removed.

Comparative Example 2

The same semiconductor device as that in FIG. 4 for Example 1 was cleaned by using an aqueous solution of 1 wt % ammonium fluoride at 23° C. for 20 min. As a result, it was observed that although the side wall protecting deposition film could be removed, violent corrosion resulted in the Al—Si—Cu layer.

EXAMPLE 4

Figure 6:
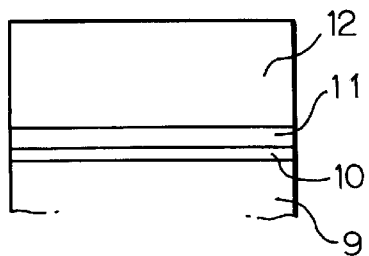
FIG. 6 is a cross sectional view showing a stage in a second example of a method of manufacturing a semiconductor device after formation of a conductive layer in accordance with the invention.

When a mask was formed with a photoresist on a semiconductor device just after forming a conductive layer of a structure shown in FIG. 6 and a wiring structure was formed by dry etching, side wall protecting deposition film formed on the side walls of the conductive layer and the photoresist were cleaned.

In a semiconductor device just after forming the conductive layer in FIG. 6, there were formed, on a CVD oxide film 9 as an intermediate insulation film, a Ti layer 10 as a first metal film layer, a TiN layer 11 as a second metal film layer and a W (tungsten) layer 12 as a third metal film layer successively.

The film thickness for each of the metal films was 300 to 500 Å for the first metal film layer 10, 500 to 700 Å for the second metal film layer 11 and 3000 Å for the third metal film layer 12.

Figure 7:
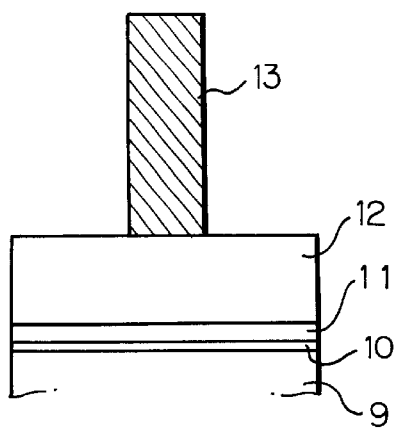
FIG. 7 is a cross sectional view showing a subsequent stage of the method of FIG. 6 and illustrating a mask forming step.

FIG. 7 shows a structure completed as far as the mask forming step. A positive type photoresist 13 was coated on the conductive layer shown in FIG. 6 and then exposed to form a resist mask portion. The photoresist 13 used had a multi-layered resist mainly composed of a novolac resin.

Figure 8:
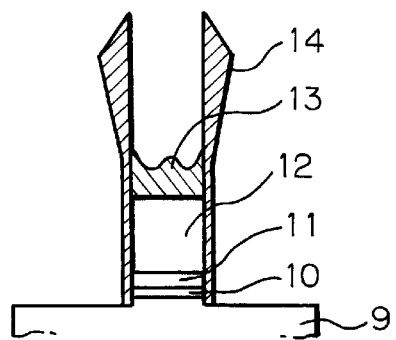
FIG. 8 is a cross sectional view of a stage of the second example of the method and subsequent to FIG. 7 after removing a region of the conductive layer not covered with a photo-mask by dry etching.

FIG. 8 shows a structure after removing a region of the conductive layer not covered with the photo-mask (nonmasked region) by dry etching. Formation of the side wall protecting deposition film 14 was already observed on the side of the patterned conductive layer.

Figure 9:
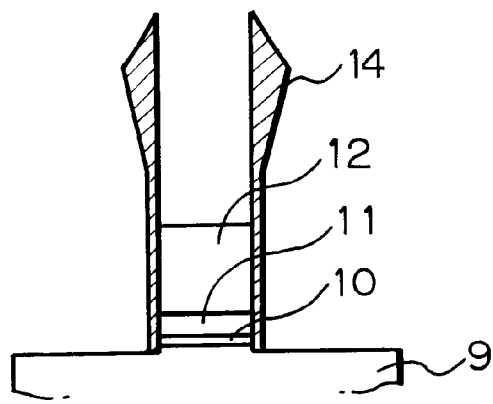
FIG. 9 is a cross sectional view of a stage of the second example of the method subsequent to FIG. 8 after removing the masking resist by ashing and cleaning with an organic solvent after dry etching.

FIG. 9 shows the structure after removing the masking resist by ashing, after dry etching. It was confirmed that although removal of the resist was possible, removal of the side wall protecting deposition film 14 was difficult by this method.

Figure 10:
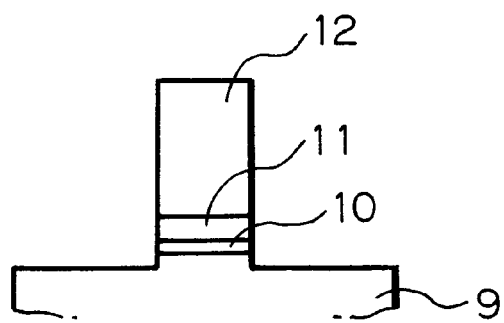
FIG. 10 is a cross sectional view of a further stage of the second example of the method after cleaning the semiconductor device shown in FIG. 9 by using the cleaning agent for the device in the second example according to the present invention.

FIG. 10 shows a structure after washing the semiconductor device in FIG. 9 by using the cleaning agent for the semiconductor device according to the present invention. An aqueous solution of ammonium fluoride/tetramethyl ammonium formate/dimethylformamide/water at 1/10/40/49 (wt % ratio) was used as the cleaning agent for the semiconductor device and cleaning was applied at 23° C. for 20 min followed by water rinsing and drying. It can be seen in FIG. 10 that the side wall protecting deposition film 14 was removed and the surface of the patterned conductive layer was decontaminated and cleaned.

EXAMPLE 5

The same semiconductor device as that in FIG. 9 for Example 4 was cleaned by using a cleaning solution comprising a composition of ammonium fluoride/tetramethyl ammonium formate/water at 2/45/53 (wt % ratio) at 23° C. for 20 min and then rinsed with water. As a result, the side wall protecting deposition film 14 was removed completely in same manner as in Example 4, so that the surface of the patterned conductive layer was decontaminated and cleaned.

EXAMPLE 6

The same semiconductor device as that in FIG. 9 for Example 4 was cleaned by using a cleaning solution comprising a composition of ammonium fluoride/trimethyl(2-hydroxyethyl)ammonium formate/dimethylformamide/water at 2/20/30/48 (wt % ratio) at 25° C. for 20 min and then rinsed with water. As a result, the side wall protecting deposition film 14 was removed completely in the same manner as in Example 4 so that the surface of the patterned conductive layer was decontaminated and cleaned.

Comparative Example 3

The same semiconductor device as that in FIG. 9 for Example 4 was cleaned by using a commercially available cleaning solution (alkaline resist cleaning solution) under the cleaning conditions at 100° C. for 20 min. As a result, the side wall protecting deposition film 14 could not be removed.

Comparative Example 4

The same semiconductor device as that in FIG. 9 for Example 4 was cleaned by using a cleaning solution comprising a composition of tetramethyl ammonium formate/dimethylformamide/water at 10/40/50 (wt % ratio) under the cleaning conditions at 25° C. for 30 min followed by water rinsing. As a result, the side wall protecting deposition film 14 could not be removed.

Since the protecting deposition film formed on the side walls of the conductive layer and the photoresist can be peeled more reliably upon forming the wiring structure by dry etching in the process for producing the semiconductor device by using the cleaning agent for the semiconductor device according to the present invention, the surface of the conductive layer is decontaminated and cleaned, so that no corrosion occurs.

Further, the cleaning agent for the semiconductor device according to the present invention is also applicable to the removal of protecting deposition film formed upon dry etching of a titanium or tungsten layer which was so far difficult to be removed, so that it can be used effectively for the manufacture of a semiconductor device or a highly integrated circuit of a multi-layered layered structure.

The following advantages can be mentioned upon using the cleaning agent for the semiconductor device according to the present invention.

(1) A protecting deposition film formed on the side walls of the conductive film and the photoresist which heretofore has been difficult to remove can be peeled in a short period of time, at normal temperature and reliably.

(2) An aluminum alloy or the like as a wiring material does not suffer from etching upon use.

(3) Since water is usable for rinsing after using the cleaning agent for the semiconductor device according to the present invention, the operation is extremely easy.

We claim:

1. A cleaning agent for removing a processing structure, from a semiconductor device during the manufacture thereof without causing corrosion of metal components included in the semiconductor device, said cleaning agent comprising an aqueous solution comprising:

a quarternary ammonium salt contained in the aqueous solution and having the general formula

$[(R_1)_3N—R]^+ \cdot X^-$ where R represents an alkyl group of 1–4 carbon atoms, or a hydroxyl substituted alkyl group of 1–4 carbon atoms, N represents nitrogen, $R_1$ represents an alkyl group of 1–4 carbon atoms, and X represents an organic or inorganic acid group; and a fluoro compound wherein the quarternary ammonium salt is selected from the group consisting of tetramethyl ammonium formate, tetramethyl ammonium acetate, tetramethyl ammonium propionate, tetramethyl ammonium butyrate, tetramethyl ammonium oxalate, tetramethyl ammonium malonate, tetramethyl ammonium maleate, tetramethyl ammonium fumarate, tetramethyl ammonium citraconate, tetramethyl ammonium benzoate, tetramethyl ammonium toluate, tetramethyl ammonium phthalate, tetramethyl ammonium acrylate, trimethyl(2-hydroxyethyl)ammonium formate, trimethyl(2-hydroxyethyl)ammonium acetate, trimethyl(2-hydroxyethyl)ammonium benzoate, trimethyl(2-hydroxyethyl)ammonium phthalate, tetraethyl ammonium formate, tetraethyl ammonium acetate, tetrapropyl ammonium formate, tetrapropyl ammonium acetate, tetrabutyl ammonium formate, tetrabutyl ammonium acetate, tetramethyl ammonium borate, tetramethyl ammonium phosphate, tetramethyl ammonium sulfate, trimethyl(2-hydroxyethyl) ammonium borate, trimethyl(2-hydroxyethyl)ammonium phosphate and trimethyl(1-hydroxyethyl)ammonium sulfate.

2. A cleaning agent as set forth in claim 1, wherein the concentration in the aqueous solution of the quarternary ammonium salt is within a range of 1–60% by weight; and the concentration in the aqueous solution of the fluoro compound is within a range of 0.1–10% by weight.

3. A cleaning agent as set forth in claim 1, further including an organic solvent contained in the aqueous solution of one or more of the organic solvents selected from the group consisting of amides, lactones, nitrites, alcohols, and esters.

4. A cleaning agent as set forth in claim 3, wherein the concentration in the aqueous solution of the organic solvent is within a range of 1–50% by weight.

5. A cleaning agent as set forth in claim 1, wherein the fluoro compound is selected from the group consisting of hydrofluoric acid, ammonium fluoride, ammonium hydrogen fluoride, ammonium borofluoride, tetramethyl ammonium fluoride and tetramethyl ammonium hydrogen fluoride.

6. A cleaning agent as set forth in claim 3, wherein the organic solvent is selected from the group consisting of dimethyl formamide, dimethyl acetamide, formamide and N-methyl pyrrolidone as amides, 𝛾-butyrolactone as a lactone, acetonitrile and benzonitrile as nitriles, methanol, ethanol, isopropanol and ethylene glycol as alcohols, and methyl acetate, ethyl acetate, and methyl benzoate as esters.

7. A cleaning agent as set forth in claim 3, wherein the concentration in the aqueous solution of the quarternary ammonium salt is within a range of 10–50% by weight, the concentration in the aqueous solution of the fluoro compound is within a range of 0.5–5% by weight, and the concentration in the aqueous solution of the organic solvent is within a range of 20–55% by weight.

8. A cleaning agent as set forth in claim 1, wherein the quarternary ammonium salt is tetramethyl ammonium formate, and the fluoro compound is ammonium fluoride.

9. A cleaning agent as set forth in claim 8, wherein the tetramethyl ammonium formate is present in an amount of 45% by weight, the ammonium fluoride is present in an amount of 2% by weight, and water is present in an amount of 53% by weight.

10. A cleaning agent as set forth in claim 3, wherein the quarternary ammonium salt is tetramethyl ammonium formate, the fluoro compound is ammonium fluoride, and the organic solvent is dimethyl formamide.

11. A cleaning agent as set forth in claim 10, wherein the tetramethyl ammonium formate is present in an amount of 10% by weight, the ammonium fluoride is present in an amount of 1% by weight, the dimethyl formamide is present in an amount of 40% by weight, and water is present in an amount of 49% by weight.

12. A cleaning agent as set forth in claim 3, wherein the quarternary ammonium salt is tetramethyl ammonium acetate, the fluoro compound is tetramethyl ammonium fluoride, and the organic solvent is dimethyl acetamide.

13. A cleaning agent as set forth in claim 12, wherein the tetramethyl ammonium acetate is present in an amount of 15% by weight, the tetramethyl ammonium fluoride is present in an amount of 5% by weight, the dimethyl acetamide is present in an amount of 40% by weight, and water is present in an amount of 40% by weight.

14. A cleaning a gent as set forth in claim 3, wherein the quarternary ammonium salt is trimethyl(2-hydroxyethyl) ammonium formate, the fluoro compound is ammonium fluoride, and the organic solvent is dimethyl formamide.

15. A cleaning agent as set forth in claim 14, wherein the trimethyl(2-hydroxyethyl)ammonium formate is present in an amount of 20% by weight, the ammonium fluoride is present in an amount of 2% by weight, the dimethyl formamide is present in an amount of 30% by weight, and water is present in an amount of 48% by weight.

* * * * *